United States Patent
Kawamura et al.

(10) Patent No.: US 10,186,813 B2
(45) Date of Patent: Jan. 22, 2019

(54) ELECTRONIC COMPONENT UNIT, ELECTRIC CONNECTION BOX, AND WIRE HARNESS

(71) Applicant: Yazaki Corporation, Tokyo (JP)

(72) Inventors: Yukihiro Kawamura, Shizuoka (JP); Takuya Nakayama, Shizuoka (JP); Yoshinori Sano, Shizuoka (JP)

(73) Assignee: YAZAKI CORORATION, Minato-ku, Tokyo (JP)

( * ) Notice: Subject to any disclaimer, the term of this patent is extended or adjusted under 35 U.S.C. 154(b) by 0 days.

(21) Appl. No.: 15/782,906

(22) Filed: Oct. 13, 2017

(65) Prior Publication Data

US 2018/0109044 A1 Apr. 19, 2018

(30) Foreign Application Priority Data

Oct. 17, 2016 (JP) .................................. 2016-203632

(51) Int. Cl.
*H01R 13/66* (2006.01)
*H01R 13/506* (2006.01)
(Continued)

(52) U.S. Cl.
CPC ..... *H01R 13/6608* (2013.01); *B60R 16/0238* (2013.01); *H01R 13/506* (2013.01);
(Continued)

(58) Field of Classification Search
CPC ................ H01R 24/64; H01R 2107/00; H01R 12/7076; H01R 12/7005; H01R 13/6585;
(Continued)

(56) References Cited

U.S. PATENT DOCUMENTS

| 6,929,487 B1 * | 8/2005 | Raghavendra ..... H01R 13/6658 439/654 |
| 2006/0030217 A1 | 2/2006 | Maebashi et al. |
| 2006/0035531 A1 * | 2/2006 | Ngo ..................... H01R 13/514 439/701 |

(Continued)

FOREIGN PATENT DOCUMENTS

| JP | 62-21716 U | 2/1987 |
| JP | 2007-295787 A | 11/2007 |
| JP | 4365745 B2 | 11/2009 |
| JP | 2012-139054 A | 7/2012 |

OTHER PUBLICATIONS

Communication dated Sep. 11, 2018, from the Japanese Patent Office in counterpart application No. 2016-203632.

*Primary Examiner* — Truc T Nguyen
(74) *Attorney, Agent, or Firm* — Sughrue Mion, PLLC

(57) ABSTRACT

An electronic component unit to be applied to an electric connection box for a wire harness includes: a substrate that has an electronic component mounted thereon and includes a terminal electrically connected to the electronic component; a casing including: a housing space portion for housing the substrate therein; and a plurality of slide assembling units that are provided in the housing space portion and each of which allows the substrate to be inserted and assembled therethrough; and a connection unit that is provided in an opening in the casing, into which the terminal of the substrate is inserted, and the connection unit is configured to electrically connect the terminal to a conductive wiring member. At least one substrate is assembled to any one of the slide assembling units and is retained between the casing and the connection unit.

16 Claims, 10 Drawing Sheets

(51) Int. Cl.
*H01R 13/516* (2006.01)
*H05K 5/00* (2006.01)
*H05K 7/02* (2006.01)
*B60R 16/023* (2006.01)

(52) U.S. Cl.
CPC ......... *H01R 13/516* (2013.01); *H05K 5/0039* (2013.01); *H05K 5/0073* (2013.01); *H05K 7/02* (2013.01)

(58) Field of Classification Search
CPC .. H01R 13/6658; H01R 24/60; H01R 12/724; H01R 13/514; H01R 13/665; H01R 43/16; H01R 12/716; H01R 12/721; H01R 12/79
See application file for complete search history.

(56) References Cited

U.S. PATENT DOCUMENTS

| | | | |
|---|---|---|---|
| 2007/0087594 A1* | 4/2007 | Kosugi | G06F 1/186 439/92 |
| 2007/0173092 A1* | 7/2007 | Von Arx | H01R 13/514 439/188 |
| 2011/0256777 A1* | 10/2011 | Schober | H05K 5/0039 439/660 |
| 2012/0094509 A1* | 4/2012 | Bryan | B60Q 11/005 439/76.1 |
| 2012/0122335 A1* | 5/2012 | Costello | H04Q 1/025 439/502 |
| 2013/0012069 A1* | 1/2013 | Liu | H01R 12/73 439/626 |
| 2013/0122745 A1* | 5/2013 | Soubh | H01R 12/724 439/607.09 |

* cited by examiner

ELECTRONIC COMPONENT UNIT, ELECTRIC CONNECTION BOX, AND WIRE HARNESS

CROSS-REFERENCE TO RELATED APPLICATION(S)

The present application claims priority to and incorporates by reference the entire contents of Japanese Patent Application No. 2016-203632 filed in Japan on Oct. 17, 2016.

BACKGROUND OF THE INVENTION

1. Field of the Invention

The present invention relates to an electronic component unit, an electric connection box, and a wire harness.

2. Description of the Related Art

As an electronic component unit to be provided to a conventional wire harness mounted on a vehicle, for example, Japanese Patent No. 4365745 discloses a unit having a connector structure in which a plurality of bus bars and a plurality of electric components are mounted on the inner side of a pair of divided housings. In the connector structure, openings for exposing the bus bars are provided in the outer walls of the pair of divided housings, and the bus bars and the electric components are connected by welding or other method through the openings, so that the pair of divided housings are inserted in a case while being bonded together. In the connector structure, the openings are closed by the outer wall of the case, and terminals of the bus bars protrude into a hood portion of the case. In this case, in the unit having the connector structure, for example, when a pair of divided housings in which bus bars and electric components are provided have the same performance and the same shape, the following effect can be obtained. Specifically, for example, in the unit having the connector structure, when a pair of divided housings in the bonded state are integrated and inserted into a case, the pair of divided housings can be easily inserted into the case without confirming the orientation of the pair of divided housings with respect to the case. Consequently, the unit can improve insertion workability.

In the case having the connector structure described in Japanese Patent No. 4365745, however, a pair of divided housings need to be bonded together when the pair of divided housings are inserted into the case. Thus, for example, the unit cannot be used with only one of the pair of divided housings. The unit has room for further improvement in terms of versatility, for example, because when the unit is used with only one of the pair of divided housings, an auxiliary component (for example, a dummy housing) as an alternative to the other of the pair of divided housings to be bonded to the one divided housing is necessary.

SUMMARY OF THE INVENTION

The present invention has been made in view of the above-mentioned circumstances, and it is an object thereof to provide an electronic component unit, an electric connection box, and a wire harness capable of improving versatility.

In order to achieve the above mentioned object, an electronic component unit according to one aspect of the present invention includes a substrate on which an electronic component is mounted, and includes a terminal electrically connected to the electronic component; a casing that is formed into a hollow shape having an opening, and includes a housing space portion that houses the substrate therein and a plurality of slide assembling units that are provided in the housing space portion and allow the substrate to be inserted and assembled thereto from the opening side along a first direction; and a connection unit that is provided in the opening in the casing, into which the terminal of the substrate assembled to the slide assembling units in the housing space portion is inserted, and is configured to electrically connect the terminal and a conductive wiring member, wherein at least one substrate is assembled to any one of the slide assembling units and is retained between the casing and the connection unit.

According to another aspect of the present invention, in the electronic component unit, it is possible to configure that the slide assembling units include rail units each of which extends along the first direction and is configured to position an end portion of the substrate with respect to a second direction intersecting with the first direction, and the slide assembling units are provided in a pair so as to be opposed in the second direction.

According to still another aspect of the present invention, in the electronic component unit, it is possible to configure that the substrate is provided to each of the slide assembling units.

According to still another aspect of the present invention, in the electronic component unit, it is possible to configure that the substrate is provided to at least one of the slide assembling units and is not provided to the other slide assembling units.

According to still another aspect of the present invention, in the electronic component unit, it is possible to configure that a pair of the substrates provided to adjacent ones of the slide assembling units have the same structure, and the electronic components on the pair of the substrates are provided on surfaces opposed to each other in a second direction intersecting with the first direction, and at least a part of the electronic components are located side by side in the first direction.

In order to achieve the above mentioned object, an electronic component unit according to one aspect of the present invention includes an electronic component unit including a substrate that has an electronic component mounted thereon and the substrate includes a terminal electrically connected to the electronic component; a casing that is formed into a hollow shape having an opening, and includes a housing space portion that houses the substrate therein and a plurality of slide assembling units that are provided in the housing space portion and the slide assembling units allow the substrate to be inserted and assembled thereto from the opening side along a first direction; and a connection unit that is provided in the opening in the casing, into which the terminal of the substrate assembled to the slide assembling units in the housing space portion is inserted, and is configured to electrically connect the terminal and a conductive wiring member; and a frame to which the electronic component unit is assembled, wherein at least one substrate is assembled to any one of the slide assembling units and is retained between the casing and the connection unit.

In order to achieve the above mentioned object, a wire harness according to one aspect of the present invention includes a conductive wiring member; and an electric connection box electrically connected to the wiring member. The electric connection box includes an electronic component unit including a substrate that has an electronic component mounted thereon and includes a terminal electrically connected to the electronic component; a casing that is formed into a hollow shape having an opening, and the casing includes a housing space portion that houses the substrate therein and a plurality of slide assembling units that are provided in the housing space portion and allow the substrate to be inserted and assembled thereto from the opening side along a first direction; and a connection unit that is provided in the opening in the casing, into which the terminal of the substrate assembled to the slide assembling units in the housing space portion is inserted, and is configured to electrically connect the terminal and the wiring member; and a frame to which the electronic component unit is assembled, and at least one substrate is assembled to any one of the slide assembling units and is retained between the casing and the connection unit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
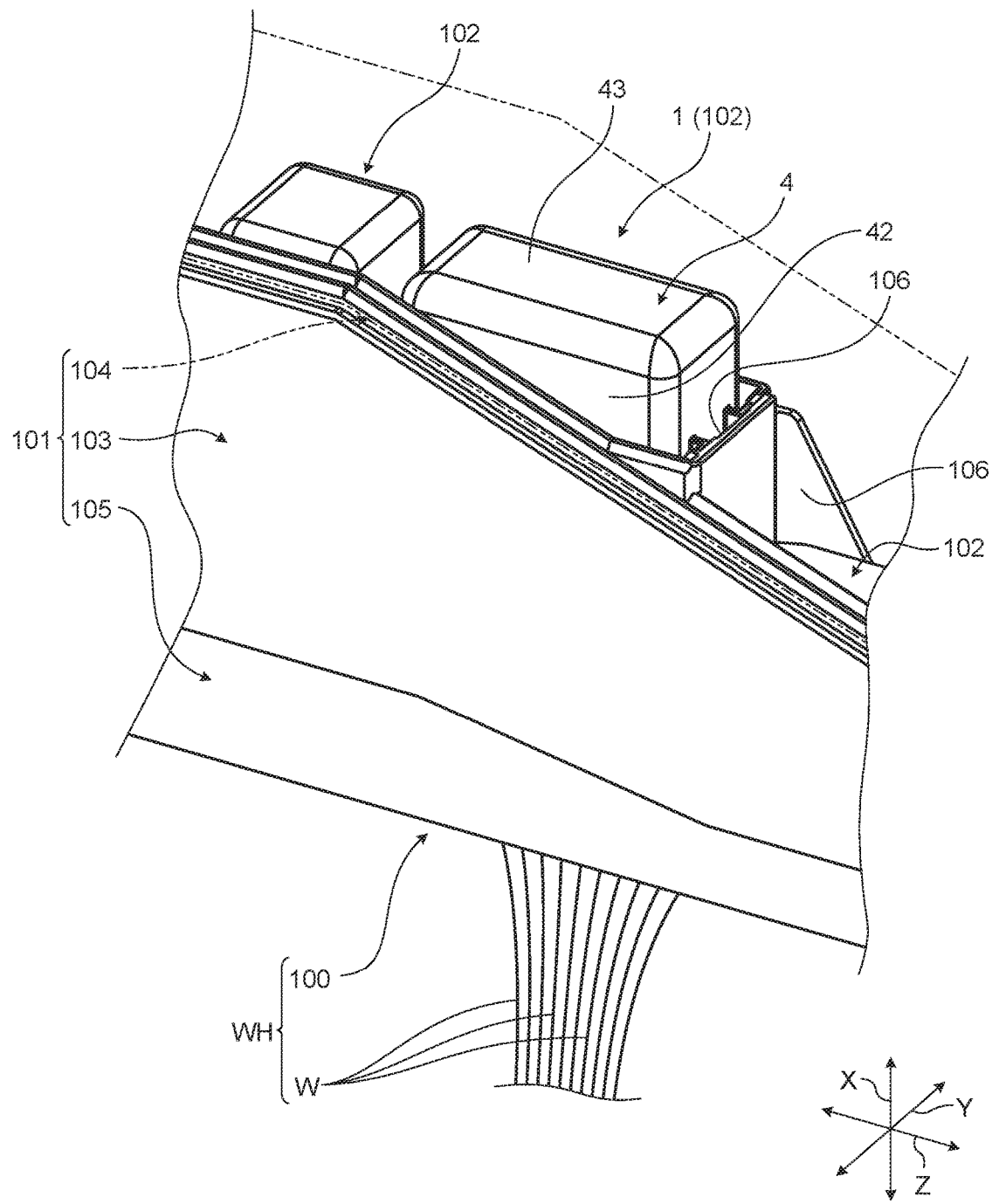
FIG. 1 is a partial perspective view illustrating a schematic configuration of an electric connection box to which an electronic component unit is applied according to an embodiment.
Figure 2:
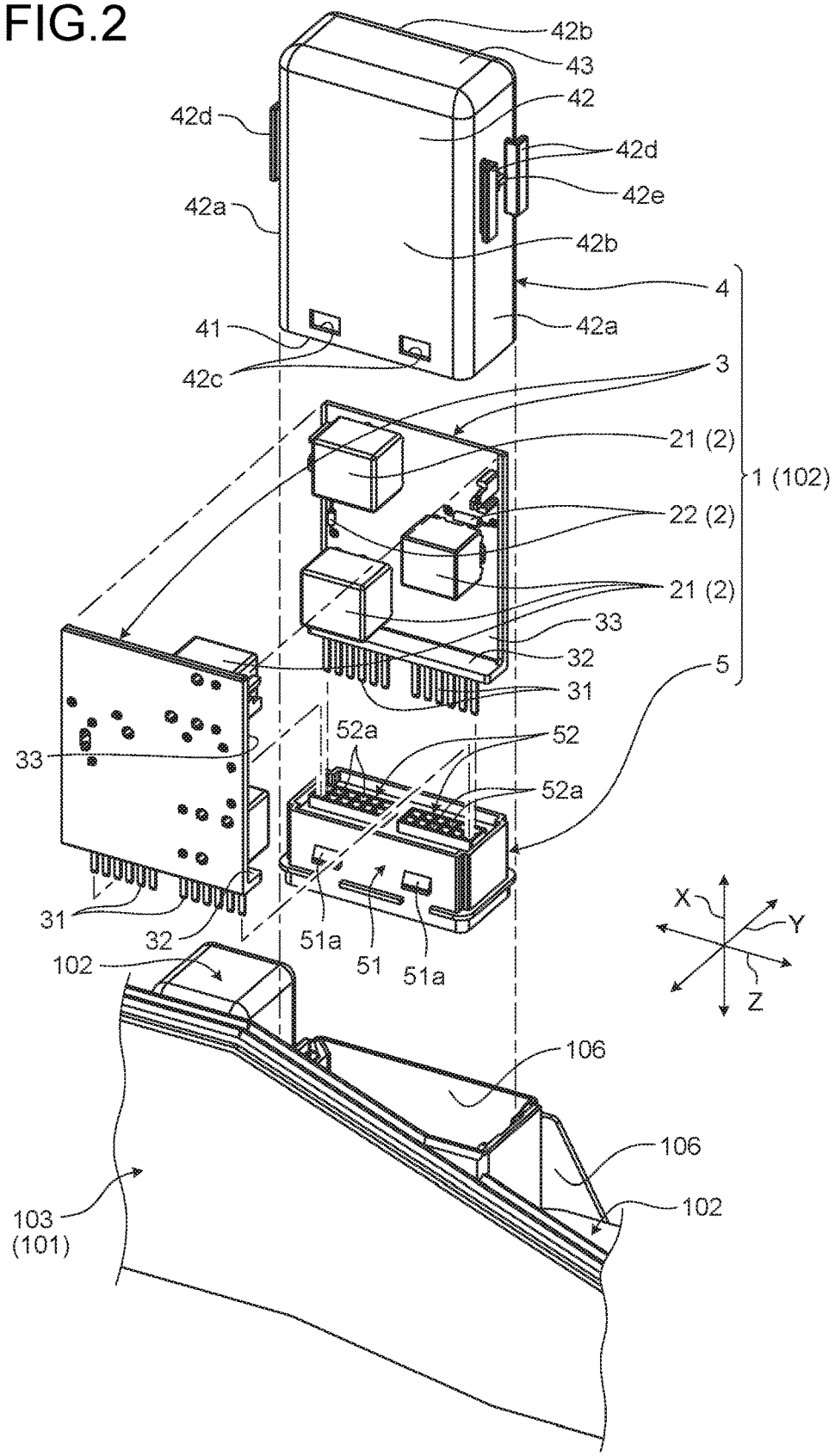
FIG. 2 is a partial exploded perspective view illustrating a schematic configuration of the electric connection box to which the electronic component unit is applied according to the embodiment.
Figure 3:
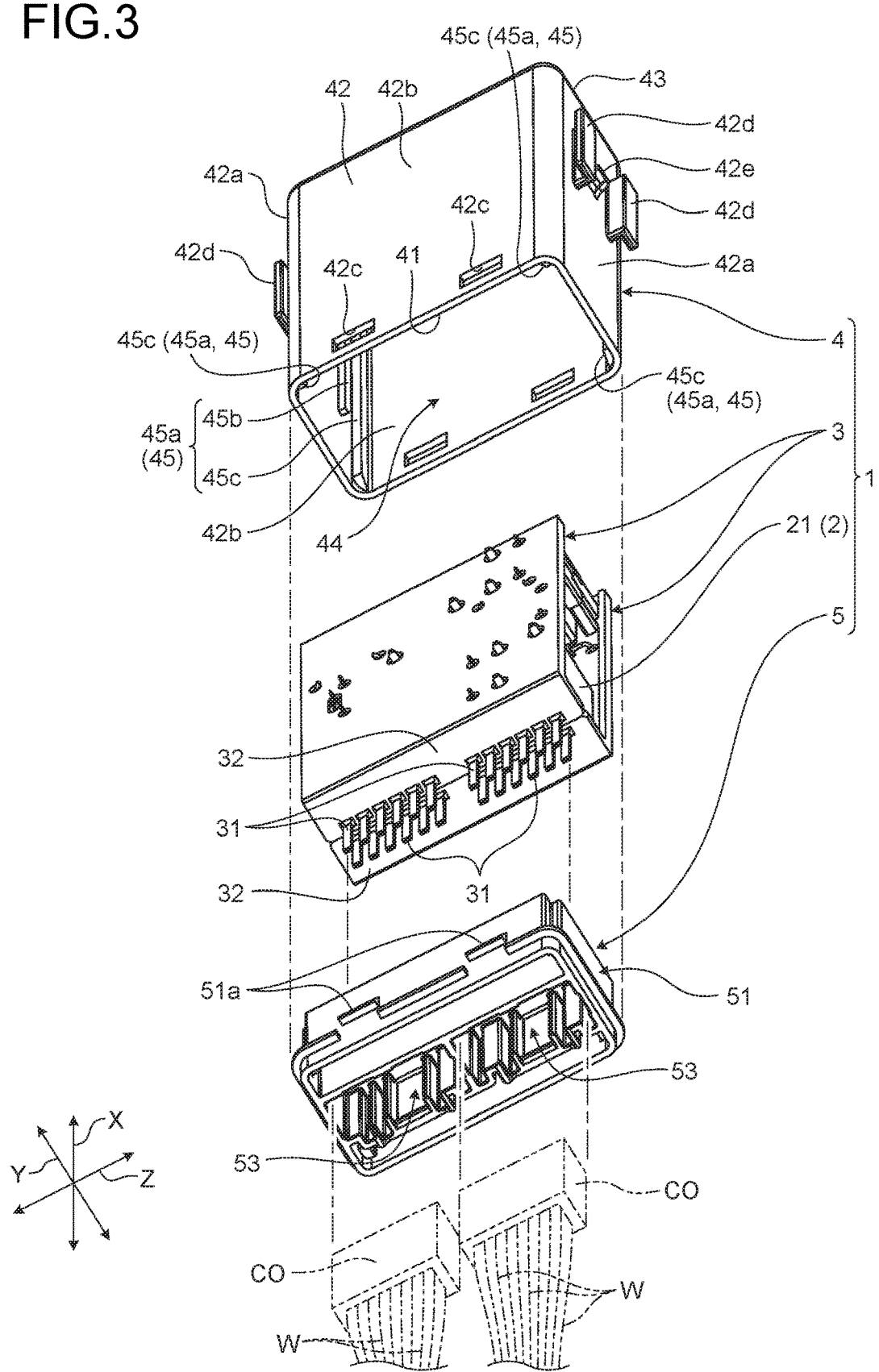
FIG. 3 is an exploded perspective view illustrating a schematic configuration of the electronic component unit according to the embodiment.
Figure 4:
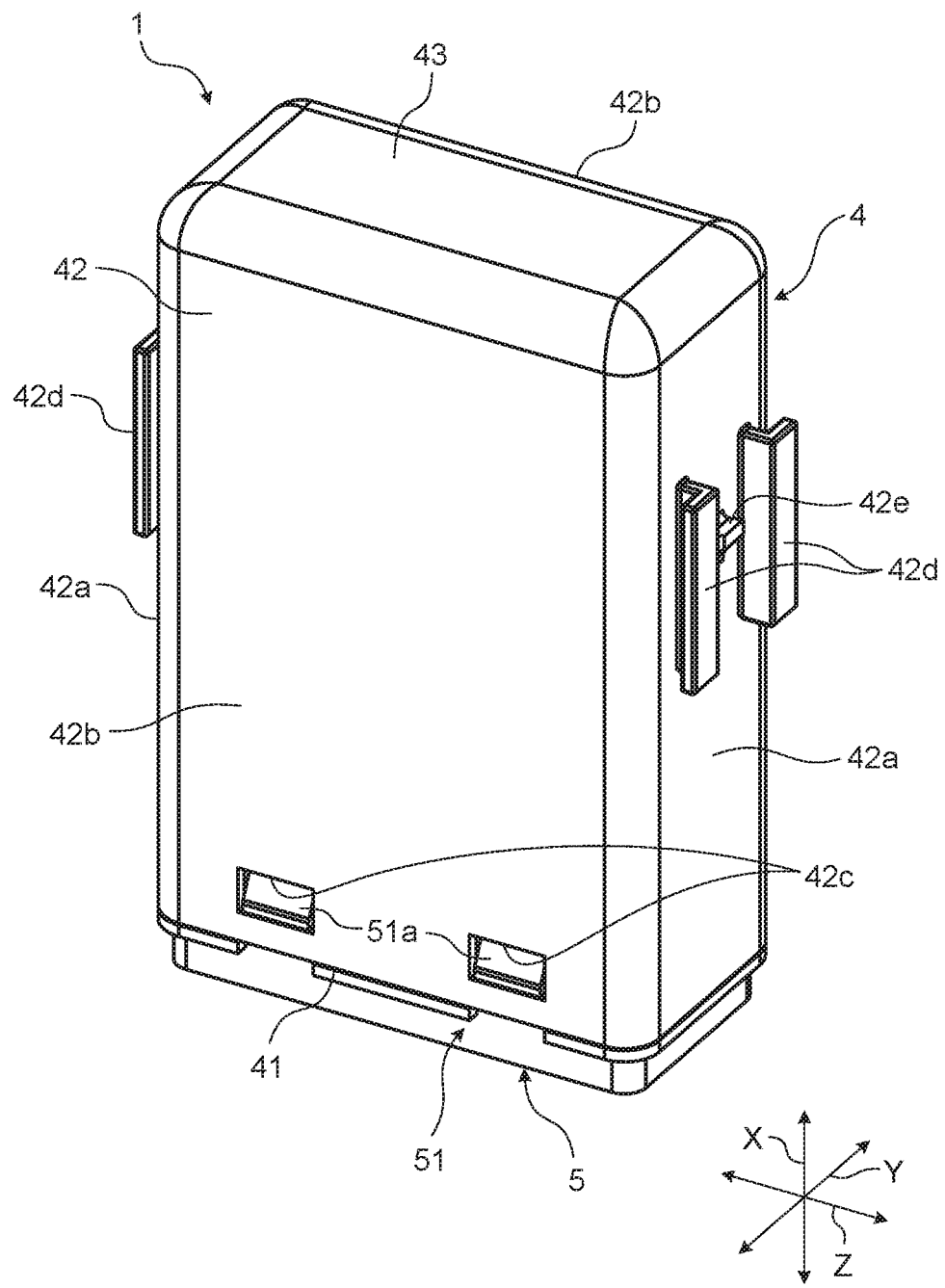
FIG. 4 is a perspective view illustrating a schematic configuration of the electronic component unit according to the embodiment.
Figure 5:
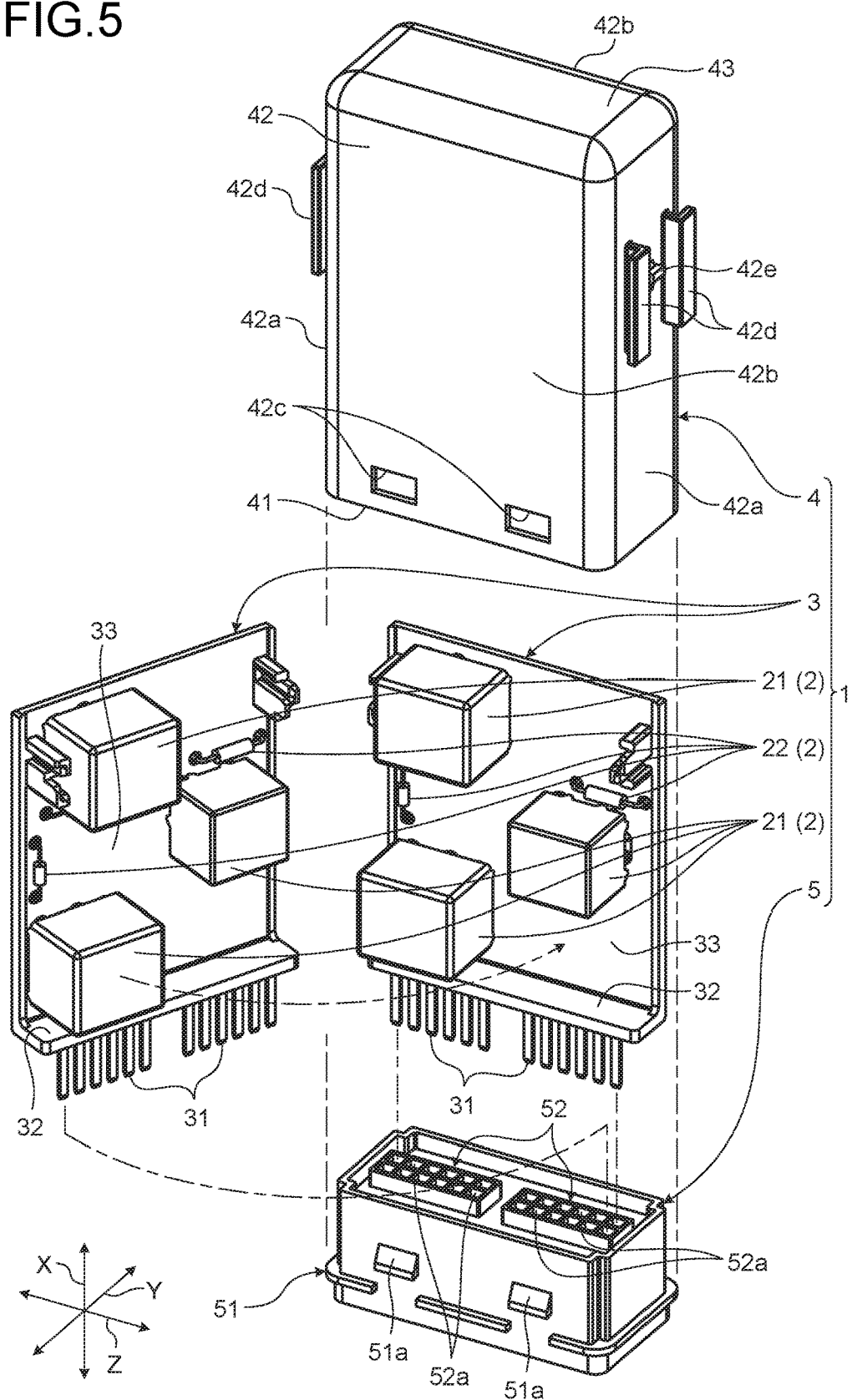
FIG. 5 is an exploded perspective view illustrating a first use mode of the electronic component unit according to the embodiment.

Embodiments of the present invention are described in detail below with reference to the accompanying drawings. The present invention is not limited by the embodiments. Components in the following embodiments include components that are easily replaceable by those skilled in the art or substantially the same components. In FIG. 1 to be referred to below, an upper cover is illustrated by two-dot chain lines, and FIG. 2 omits the illustration of the upper cover, a lower cover, and wiring members. In FIG. 3, the wiring members and connectors provided at the terminals of the wiring members are illustrated by two-dot chain lines, and FIG. 4, FIG. 5, FIG. 6, FIG. 7, FIG. 8, FIG. 9, and FIG. 10 omit the illustration thereof.

EMBODIMENTS

An electronic component unit 1 according to the present embodiment illustrated in FIG. 1, FIG. 2, FIG. 3, and FIG. 4 constitutes an electronic component module to be removably assembled to an electric connection box 100 mounted on a vehicle such as an automobile. The electric connection box 100 is mounted on a vehicle and assembled to a wire harness WH, and houses electric equipment such as connectors, fuses, relays, capacitors, branch units, and an electronic control unit therein in a collective manner. For example, the wire harness WH is used to connect devices mounted on the vehicle, and is obtained by bundling wiring members W used for power supply and signal communication into a collective part, and the wiring members W are connected to each of the devices through a connector or other part. The wire harness WH includes the conductive wiring members W and the electric connection box 100 electrically connected to the wiring members W. For example, the wiring members W is formed of a metal rod obtained by covering the outer side of a conductive rod-shaped member with an insulating coating, an electric wire obtained by covering the outer side of a conductor (core) made of conductive metal wires with an insulating coating, or an electric wire bundle obtained by bundling the electric wires. The wire harness WH collectively bundles the wiring members W, and is electrically connected to the electric connection box 100 through a connector CO or other part that is a connection member provided at the terminals of the bundled wiring members W. The wire harness WH may further include a grommet, a protector, or a fixing tool.

For example, the electric connection box 100 is placed in a vehicle engine compartment (engine room) or on the vehicle interior side, and is connected between a power supply such as a battery and various kinds of electronic devices mounted in the vehicle, so that power supplied from the power supply is distributed to various kinds of electronic devices in the vehicle. The electric connection box 100 is sometimes referred to as "junction box", "fuse box", and "relay box". In the present embodiment, these are collectively referred to as "electric connection box". The electric connection box 100 includes a casing 101, and various electronic components 102 provided in a housing space portion inside the casing 101. For example, the casing 101 includes a frame 103, an upper cover 104, and a lower cover 105. The casing 101 has a three-layer divided structure in which the frame 103, the upper cover 104, and the lower cover 105 are divided. The frame 103, the upper cover 104, and the lower cover 105 are formed from an insulating synthetic resin. The frame 103 is a principal member that forms the housing space portion in which the electronic components 102 are assembled. The frame 103 is formed into a tubular frame shape having openings in two opposed surfaces. The upper cover 104 is a lid-shaped member that closes one opening in the frame 103 (for example, the opening located on the upper side in the vertical direction in the state in which the electric connection box 100 is connected to the engine compartment). The lower cover 105 is a dish-shaped (tray-shaped) member that closes the other opening in the frame 103 (for example, the opening located on the lower side in the vertical direction in the state in which the electric connection box 100 is connected to the engine compartment). In the casing 101, the upper cover 104 and the lower cover 105 are assembled to the frame 103 such that the one opening in the frame 103 is opposed to the upper cover 104 and the other opening in the frame 103 is opposed to the lower cover 105, thereby forming the housing space portion for housing various electronic components 102 therein. In the casing 101, the upper cover 104 and the lower cover 105 are locked to the frame 103 through locking mechanisms in various forms. Various electronic components 102 assembled in the housing space portion inside the casing 101 include connectors, fuses, relays, branch units, and an electronic control unit as described above as well as the electronic component unit 1 in the present embodiment. In the electric connection box 100, the various electronic components 102 are assembled in a cavity 106 provided in the frame 103. In the electric connection box 100, connectors CO, terminals, and other parts provided at the terminals of wiring members W are fitted in the cavity 106 in which various electronic components 102 are assembled from the side opposite to the electronic components 102, and are electrically connected to the electronic components 102. Referring to the drawings, the configuration of the electronic component unit 1 is described in detail below.

In the following description, of a first direction, a second direction, and a third direction orthogonal to one another, the first direction is referred to as "insertion direction X", the second direction is referred to as "stacking direction Y", and the third direction is referred to as "width direction Z". The insertion direction X, the stacking direction Y, and the width direction Z are orthogonal to one another. The insertion direction X typically corresponds to the opening direction of the frame 103. Unless otherwise stated, the directions used in the following description represent directions in the state in which the units are assembled to one another.

Specifically, the electronic component unit 1 in the present embodiment includes electronic components 2, substrates 3, a casing 4, and a connector block 5 serving as a connection unit. For example, the electronic component unit 1 is connected between a power supply such as a battery mounted on a vehicle and various kinds of electronic devices mounted on the vehicle. The electronic component unit 1 constitutes a module configured to distribute power and communicate signals to various kinds of electronic devices.

The electronic components 2 are mounted on the substrate 3, and are elements that exhibit various functions. Examples of the electronic components 2 include a capacitor, a relay, a resistor, a transistor, an intelligent power switch (IPS), and an electronic control unit including a microcomputer.

The substrate 3 is an electronic circuit on which the electronic components 2 are mounted and that electrically connects the electronic components 2. The substrate 3 has terminals 31 to be electrically connected to the electronic components 2. The substrate 3 in the present embodiment is an insert bus bar substrate in which a bus bar made of conductive metal material is incorporated in insulating resin material. The substrate 3 is formed into a substantially rectangular plate shape as a whole. The substrate 3 extends into a plate shape along the insertion direction X and the width direction Z such that the thickness direction is along the stacking direction Y. An end portion of the substrate 3 on one side in the insertion direction X is bent in the stacking direction Y to form a bent end portion 32. In the substrate 3, a part of the bus bars are exposed from the resin member at the bent end portion 32 to form the terminals 31. The terminal 31 is formed into a straight rod shape extending along the insertion direction X from a surface of the bent end portion 32 of the substrate 3 on one side in the insertion direction X. The terminals 31 (twelve terminals for each substrate 3) are provided side by side on the surface of the bent end portion 32 on one side in the insertion direction X along the width direction Z with intervals. The electronic components 2 is mounted on the substrate 3 in a manner that lead wires or terminals of the electronic component 2 are inserted to through holes formed to pass through the substrate 3 along the stacking direction Y, for example, and are electrically connected to the bus bars by soldering or other method. In the substrate 3 in the present embodiment, relays 21 and relay resistors 22 are mounted as electronic components 2 on a mounting surface 33 on one side in the stacking direction Y. In other words, the electronic component unit 1 in the present embodiment constitutes a relay unit module. Depending on use modes described later, the number of substrates 3 provided may be plural (two in the present embodiment) (see FIG. 2, FIG. 5, FIG. 6, and FIG. 7) or may be one (see FIG. 8, FIG. 9, and FIG. 10). The use modes for the substrate 3 are described in detail later.

The substrate 3 is not limited to an insert bus bar substrate, and may be what is called a printed circuit substrate. In this case, the substrate 3 is formed by printing a wiring pattern (printed pattern) made of conductive material such as copper on an insulating layer made of insulating material such as an epoxy resin, a glass epoxy resin, a paper epoxy resin, or a ceramic. The electronic component 2 is mounted on the substrate 3 in a manner that the electronic component 2 is electrically connected to the wiring pattern by soldering or other method.

The casing 4 houses the substrate 3 therein. The casing 4 is formed from an insulating synthetic resin. The casing 4 is formed into a hollow shape having an opening 41. The casing 4 in the present embodiment is formed into a hollow box shape having the opening 41 on one side in the insertion direction X. More specifically, the casing 4 includes a rectangular frame portion 42 as a wall body formed into a substantially square shape, and a ceiling portion 43 for closing the other side of the rectangular frame portion 42 in the insertion direction X (on the side opposite to the opening 41). The casing 4 is formed such that the stacking direction Y is the short-side direction and the width direction Z is the long-side direction. The ceiling portion 43 is a ceiling body formed into a rectangular plate shape in which sides along the stacking direction Y are short sides and sides along the width direction Z are long sides. The rectangular frame portion 42 is formed to be upright at an edge portion of the ceiling portion 43. The rectangular frame portion 42 is formed to include a pair of short-side side wall surfaces 42a along the lateral direction of the ceiling portion 43 and a pair of long-side side wall surfaces 42b along the longitudinal direction of the ceiling portion 43. The casing 4 is formed into a substantially rectangular parallelepiped box shape by the rectangular frame portion 42 and the ceiling portion 43, in which the opening 41 is formed on one side and the other side is closed. The connector block 5 described later is provided in the opening 41. The casing 4 has a housing space portion 44 and slide assembling units 45.

The housing space portion 44 is an internal space portion surrounded by the rectangular frame portion 42 and the ceiling portion 43, and houses the substrate 3 therein. In the casing 4, the housing space portion 44 is defined between the casing 4 and the connector block 5 provided in the opening 41.

Figure 6:
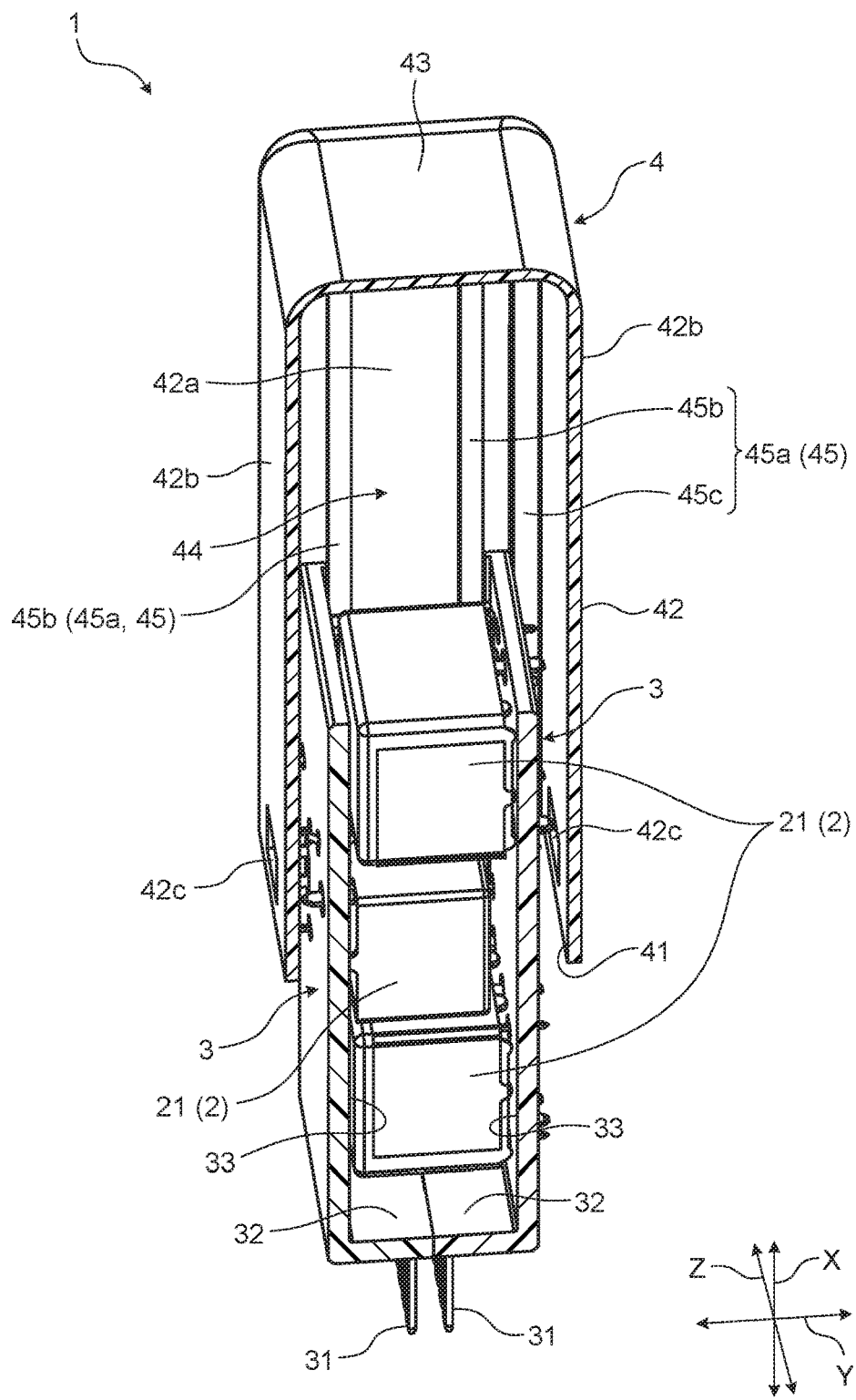
FIG. 6 is a cross-sectional perspective view illustrating the first use mode of the electronic component unit according to the embodiment.
Figure 7:
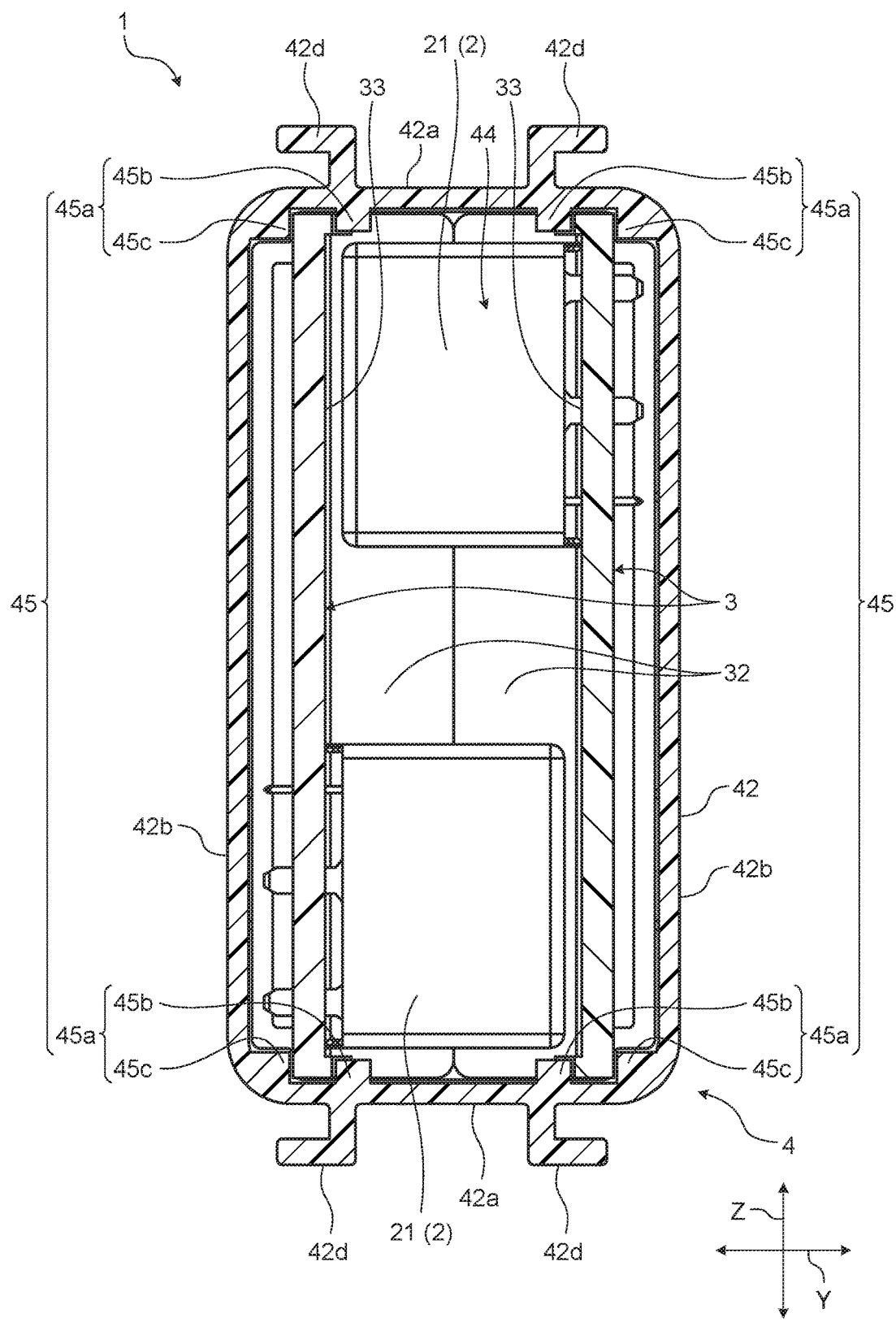
FIG. 7 is a cross-sectional view illustrating the first use mode of the electronic component unit according to the embodiment.

The slide assembling unit 45 is a unit that is provided in the housing space portion 44 and through which the substrate 3 can be inserted and assembled from the opening 41 side along the insertion direction X. As illustrated in FIG. 6 and FIG. 7, the slide assembling units 45 are provided in the housing space portion 44, each of which can insert and assemble the substrate 3 therein. Each of the slide assembling units 45 includes rail units 45a. The rail unit 45a is formed to extend along the insertion direction X, and is configured to position the end portion of the substrate 3 with respect to the stacking direction Y. The rail units 45a in one slide assembling unit 45 are provided in a pair at positions opposed in the width direction Z (see, in particular, FIG. 7). Specifically, each of the slide assembling units 45 includes a pair of rail units 45a provided at positions opposed in the width direction Z. Each of the rail units 45a includes a pair of linear protruding portions 45b and 45c, which are formed to protrude from faces of corresponding short-side side wall surfaces 42a on the housing space portion 44 side toward the housing space portion 44 along the width direction Z and that are formed into a straight line to extend along the insertion direction X. The pair of linear protruding portions 45b and 45c are provided on each of the short-side side wall surfaces 42a with an interval in the stacking direction Y that has a length corresponding to the thickness of the substrate 3. Each of the rail units 45a is configured such that end portions of the substrate 3 in the width direction Z (in other words, end portions along the insertion direction X) are inserted between the linear protruding portion 45b and the linear protruding portion 45c, and the end portions of the substrate 3 are positioned with respect to the stacking direction Y. Specifically, each of the slide assembling units 45 is configured such that both end portions of the substrate 3 in the width direction Z are positioned with respect to the stacking direction Y by the pair of rail units 45a provided at positions opposed in the width direction Z.

The slide assembling units 45 in the present embodiment are provided in a pair so as to be opposed in the stacking direction Y. Specifically, in the casing 4 in the present embodiment, the rail units 45a each formed of a pair of linear protruding portions 45b and 45c are provided for each slide assembling unit 45 in a pair so as to be opposed in the width direction Z, and two sets of the pairs of linear protruding portions 45b and 45c are provided so as to be opposed in the stacking direction Y. More specifically, in the casing 4, four sets of the rail units 45a each formed of a pair of linear protruding portions 45b and 45c are provided in total, and a pair of the rail units 45a opposed in the width direction Z constitute a first slide assembling unit 45 while the other pair of the rail units 45a opposed in the width direction Z constitute a second slide assembling unit 45. In the casing 4, the pair of rail units 45a constituting the first slide assembling unit 45 and the pair of rail units 45a constituting the second slide assembling unit 45 are located so as to be opposed in the stacking direction Y. In other words, four sets of the rail units 45a each formed of a pair of linear protruding portions 45b and 45c are provided in total on the surface of the casing 4 on the housing space portion 44 side one by one at positions opposed to each other in the stacking direction Y and the width direction Z, and the four sets of the rail units 45a constitute a pair of slide assembling units 45 corresponding to the stacking direction Y. The pair of slide assembling units 45 are formed such that the linear protruding portions 45c of the four rail units 45a in total are located one by one at four corner portions formed by a pair of short-side side wall surfaces 42a and a pair of long-side side wall surfaces 42b.

The connector block 5 allows the terminals 31 of the substrate 3, which is provided in the opening 41 in the casing 4 and assembled to the slide assembling units 45 in the housing space portion 44, to be inserted therethrough to electrically connect the substrate 3 and the wiring members W. The connector block 5 is formed from an insulating synthetic resin. The connector block 5 includes a body portion 51, terminal insertion portions 52, and connector fitting portions 53, and these portions are integrally formed.

The body portion 51 is formed into a substantially rectangular parallelepiped box shape having an outer shape that can be fitted in the opening 41. In the connector block 5, the body portion 51 is mounted in the opening 41 in the casing 4 and locked to the opening 41 through various locking mechanisms. In the present embodiment, in the connector block 5, a locking claw portion 51a provided on the body portion 51 of the connector block 5 is locked with a locking recessed portion 42c provided on each short-side side wall surface 42a of the casing 4, thereby locking the connector block 5 to the opening 41 in the casing 4 and assembled to the casing 4 in a removable manner.

A terminal insertion portion 52 is a portion through which the terminals 31 of the substrate 3 are inserted, and is provided on an end surface of the body portion 51 on one side in the insertion direction X. In the terminal insertion portion 52, terminal insertion holes 52a are provided correspondingly to the terminals 31 of the substrate 3. The terminal insertion hole 52a is a hole through which the terminal 31 of the substrate 3 is inserted, and passes, along the insertion direction X, through an end surface of the body portion 51 on one side in the insertion direction X. The terminal insertion hole 52a is sometimes referred to as "cavity". The terminal insertion holes 52a are formed with the number and at positions corresponding to the terminals 31 of the substrate 3. The terminal insertion holes 52a in the present embodiment are formed with the number and at positions that enable, when substrates 3 are assembled to the slide assembling units 45, all terminals 31 of the substrates 3 (maximum two substrates 3 in the present embodiment) to be inserted. In the present embodiment, the same number (twelve) of terminal insertion holes 52a as the number of terminals 31 of each substrate 3 are provided side by side with intervals along the width direction Z, and a set of these terminal insertion holes 52a are provided in two rows (24 in total) along the stacking direction Y.

A connector fitting portion 53 is a portion in which the connector CO provided at the terminals of the wiring members W is fitted such that the connector CO is electrically connected to the terminals 31 of the substrate 3. The connector fitting portion 53 is formed as a hollow portion in an end surface of the body portion 51 on the other side in the insertion direction X, that is, on the rear surface side of the terminal insertion portion 52. The connector fitting portion 53 is a recessed portion in which the connector CO is to be fitted, and is formed into a shape corresponding to the outer shape of the connector CO. The connector fitting portions 53 are formed at two locations, and two connectors CO in total are fitted in the two connector fitting portions 53 one by one. The tip portion of each of the terminals 31 of the substrate 3 is exposed in the connector fitting portion 53 through the terminal insertion hole 52a in the state in which the terminal 31 is inserted in the terminal insertion hole 52a in the terminal insertion portion 52. In this state, each of the terminals 31 of the substrate 3 is electrically connected to the connector CO fitted in the corresponding connector fitting portion 53.

In the electronic component unit 1 configured as described above, the end portion of the substrate 3 in the width direction Z is inserted along the insertion direction X between the linear protruding portion 45b and the linear protruding portion 45c constituting the rail unit 45a of the slide assembling unit 45, thereby assembling the substrate 3 to the slide assembling unit 45 of the casing 4 (see FIG. 6 and FIG. 7). In the electronic component unit 1, the substrate 3 is housed in the housing space portion 44 in the state in which the substrate 3 is assembled to the slide assembling unit 45 and positioned with respect to the stacking direction Y. In the electronic component unit 1, the terminals 31 of the substrate 3 are inserted in the terminal insertion holes 52a formed in the terminal insertion portion 52 of the connector block 5, and the locking claw portion 51a is locked with the locking recessed portion 42c, thereby locking and assembling the body portion 51 of the connector block 5 to the opening 41 in the casing 4. In the electronic component unit 1, the substrate 3 is retained between the casing 4 and the connector block 5 in the state in which the substrate 3 is assembled to the slide assembling unit 45 in the housing space portion 44. The electronic component unit 1 is assembled into the cavity 106 for the frame 103 through parts such as a guide rail unit 42d and a locking claw portion 42e formed on the outer surface of the casing 4 (surface on side opposite to the housing space portion 44). In this state, the electronic component unit 1 is electrically connected to the wiring members W through the terminals 31 when the connectors CO are fitted in the corresponding connector fitting portions 53.

In this case, the electronic component unit 1 in the present embodiment may be configured such that the substrate 3 is provided selectively to the slide assembling units 45 in accordance with specifications of a vehicle, for example, to which the electronic component unit 1 is applied. Thus, the electronic component unit 1 can be used in use modes for the substrate 3, thereby improving versatility. In any of the use modes, at least one substrate 3 is assembled to any one of the slide assembling units 45.

Specifically, in the first use mode of the electronic component unit 1 illustrated in FIG. 2, FIG. 5, FIG. 6, and FIG. 7, the substrates 3 are provided to all the slide assembling units 45. In the first use mode, two substrates 3 in total are provided one by one for each pair of slide assembling units 45 provided so as to be opposed in the stacking direction Y. In the present embodiment, a pair of substrates 3 provided to adjacent slide assembling units 45 have the same structure. In the pair of substrates 3, electronic components 2 are provided on mounting surfaces 33 opposed to each other in the stacking direction Y, and at least a part of the electronic components 2 are located side by side in the insertion direction X. More specifically, each of the substrates 3 is assembled to a corresponding slide assembling unit 45 and housed in the housing space portion 44 with a positional relation in which the mounting surfaces 33 are opposed in the stacking direction Y and the distal end portions of the bent end portions 32 are opposed along the stacking direction Y. In this state, the electronic p components 2 on the substrates 3 are located between the opposed mounting surfaces 33. Each of the substrates 3 has three relays 21 mounted on the corresponding mounting surface 33 as electronic components 2. On the mounting surface 33, the relays 21 are arranged one by one on both end portions in the insertion direction X on one side in the width direction Z, and one relay 21 is arranged at the center part in the insertion direction X on the other side in the width direction Z. The substrates 3 are arranged such that the mounting surfaces 33 are opposed to one another in the stacking direction Y, and the relays 21 on one substrate 3 and the relays 21 on the other substrate 3 are located side by side at three positions alternatingly along the insertion direction X. Two rows of the three relays 21 are formed along the width direction Z. Specifically, in the substrates 3, the six relays 21 in total are located between the mounting surfaces 33 side by side in a grid shape along the insertion direction X and the width direction Z in the state in which the substrates 3 are provided to the slide assembling units 45.

Figure 8:
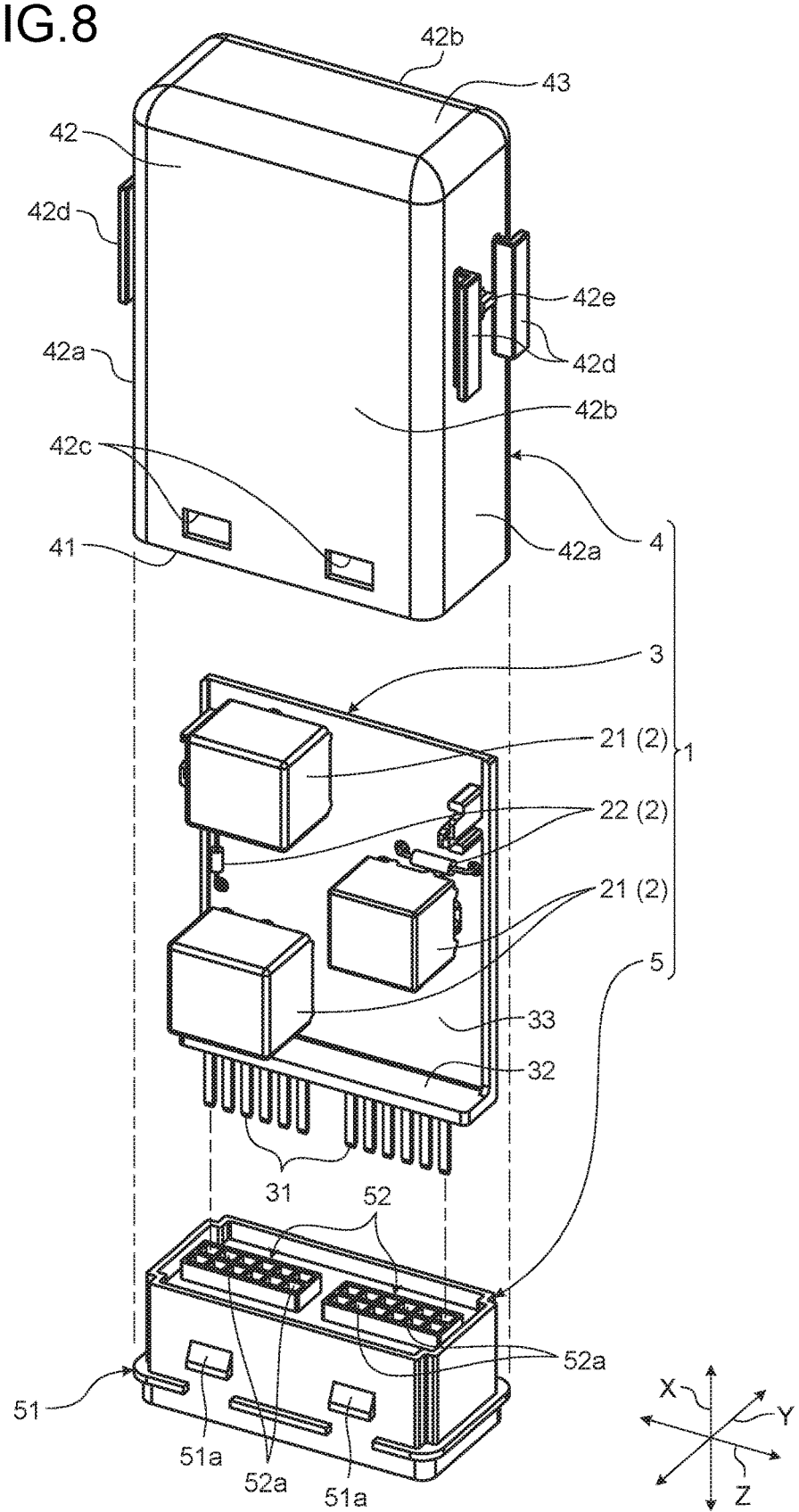
FIG. 8 is an exploded perspective view illustrating a second use mode of the electronic component unit according to the embodiment.
Figure 9:
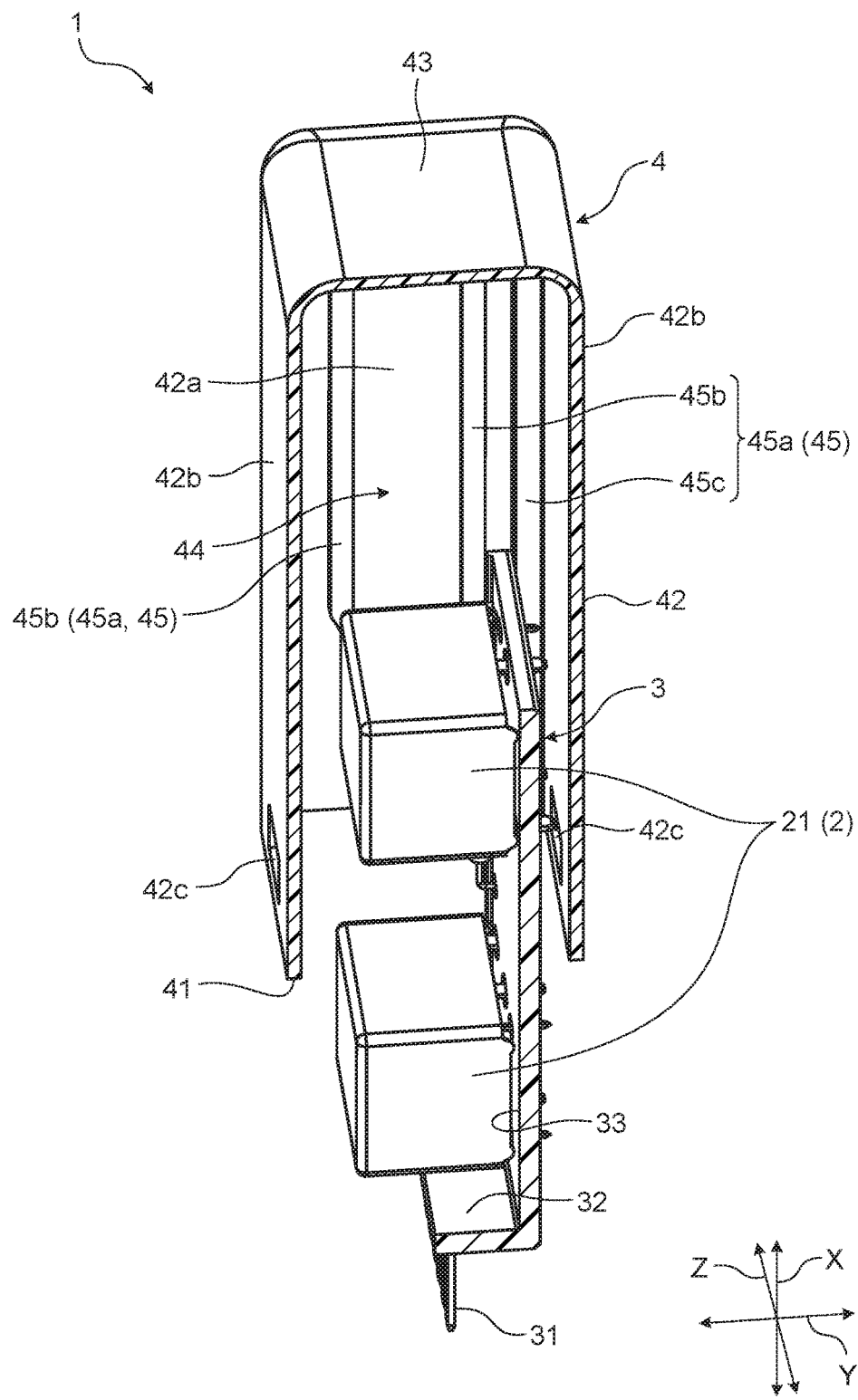
FIG. 9 is a cross-sectional perspective view illustrating the second use mode of the electronic component unit according to the embodiment.
Figure 10:
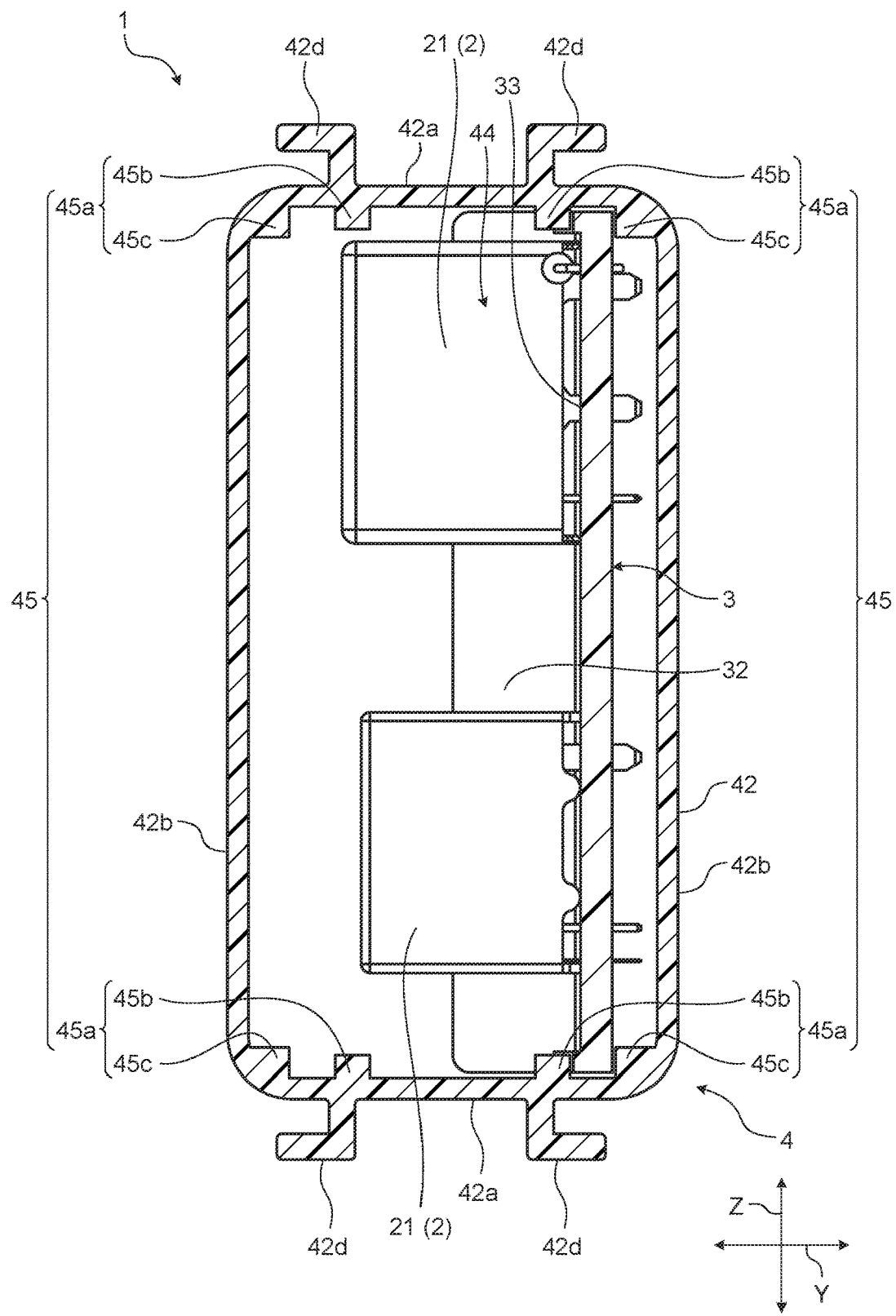
FIG. 10 is a cross-sectional view illustrating the second use mode of the electronic component unit according to the embodiment.

In the second use mode of the electronic component unit 1 illustrated in FIG. 8, FIG. 9, and FIG. 10, on the other hand, the substrate 3 is provided to at least one of the slide assembling units 45, and is not provided to the other slide assembling units 45. In the second use mode, the substrate 3 is provided to one of a pair of slide assembling units 45 provided so as to be opposed in the stacking direction Y, and is not provided to the other slide assembling unit 45.

As described above, the electronic component unit 1 in the present embodiment can be selectively used in the first use mode and the second use mode for the substrate 3, and hence can easily respond to variations in accordance with specifications of a vehicle, for example. In the electronic component unit 1 in the present embodiment, the common connector block 5 is applied in either of the first use mode or the second use mode. In this case, the number of polarities of the connectors CO connected to the electronic component unit 1 may be changed as appropriate in accordance with the number of substrates 3 used, more specifically, the number of terminals 31.

The electronic component unit 1 in the present embodiment can be used in other use modes for the substrate 3 by appropriately changing the number of electronic components 2 mounted on the substrate 3 in accordance with specifications of a vehicle, for example, to which the electronic component unit 1 is applied. Consequently, the electronic component unit 1 can respond to a larger number of variations in accordance with specifications of a vehicle, for example. For example, in the electronic component unit 1 in the present embodiment, the number of relays 21 as the electronic component 2 provided in the electric connection box 100 can be changed from one to six in accordance with specifications of a vehicle to which the electronic component unit 1 is applied. When specifications of a vehicle, for example, to which the electronic component unit 1 is applied indicate that the relay 21 in the electronic component unit 1 is not necessary, the electronic component unit 1 is not required to be provided to the electric connection box 100. The electric connection box 100 may be configured such that, when the number of relays 21 used in accordance with specifications of a vehicle, for example, to which the electric connection box 100 is applied is one or two, the relays 21 are provided to the electric connection box 100 through another connector block (for example, a dedicated connector block for providing one or two relays 21 to the electric connection box 100) instead of the electronic component unit 1.

In the electronic component unit 1, the electric connection box 100, and the wire harness WH described above, the substrate 3 having the electronic components 2 mounted thereon is retained between the casing 4 and the connector block 5 under the state in which the substrate 3 is assembled to the slide assembling unit 45 in the housing space portion 44 in the casing 4, and the terminal 31 of the substrate 3 is electrically connected to the wiring member W in the connector block 5. The electronic component unit 1, the electric connection box 100, and the wire harness WH may be configured such that the substrate 3 is provided to at least one of the slide assembling units 45 and is not provided to the other slide assembling units 45, and may be configured such that the substrates 3 are provided to all the plurality of slide assembling units 45. In this case, the electronic component unit 1, the electric connection box 100, and the wire harness WH are configured such that the substrates 3 can be individually assembled to the slide assembling units 45 in the casing 4, and hence, for example, even when the number of substrates 3 to be applied is one, the substrate 3 can be properly assembled to the casing 4 without providing an auxiliary component (for example, a dummy substrate) for assisting the assembly of the substrate 3 into the casing 4. Consequently, the electronic component unit 1, the electric connection box 100, and the wire harness WH can improve versatility and easily respond to variations in accordance with specifications of a vehicle, for example. Thus, for example, manufacturing cost can be suppressed.

More specifically, in the electronic component unit 1, the electric connection box 100, and the wire harness WH described above, the slide assembling units 45 include the rail units 45a and are provided in a pair so as to be opposed in the stacking direction Y. Consequently, when a pair of substrates 3 are applied, the electronic component unit 1, the electric connection box 100, and the wire harness WH enable the pair of substrates 3 to be assembled in the casing 4 while the rail units 45a are used to oppose the substrates 3 in the stacking direction Y.

In the electronic component unit 1, the electric connection box 100, and the wire harness WH described above, when a pair of substrates 3 are applied, the pair of substrates 3 have the same structure, and hence when each of the substrates 3 is inserted through corresponding slide assembling units 45 of the casing 4, the pair of substrates 3 can be easily inserted in the casing 4 without confirming the orientation of the substrate 3 with respect to the casing 4, and the workability of assembling the substrate 3 can be improved. In the electronic component unit 1, the electric connection box 100, and the wire harness WH described above, the electronic components 2 on the pair of substrates 3, in this case, the relays 21 are provided on mounting surfaces 33 opposed to each other in the stacking direction Y, and at least a part of the relays 21 are located side by side in the insertion direction X. Consequently, the electronic component unit 1, the electric connection box 100, and the wire harness WH enable a pair of substrates 3 to be assembled in the casing 4 in a more compact state, thus suppressing the upsizing.

The electronic component unit, the electric connection box, and the wire harness according to the embodiment of the present invention described above is not limited to the above-mentioned embodiment, and may be variously modified within the scope recited in claims.

The electronic component unit 1 described above constitutes an electronic component module to be removably assembled to the electric connection box 100. Without being limited thereto, the electronic component unit 1 in the present embodiment may be applied to members other than the electric connection box 100 and the wire harness WH.

In the electronic component unit 1 described above, the slide assembling units 45 are provided in a pair so as to be opposed in the stacking direction Y. Without being limited thereto, three or more slide assembling units 45 may be provided. In other words, three or more substrates 3 may be assembled in the casing 4.

The substrates 3 described above are formed of the same structure. However, the configuration of the substrates 3 is not limited thereto, and the substrates 3 may have different structures as long as each substrate 3 can be assembled to the slide assembling unit 45. For example, the substrates 3 described above may have different kinds and numbers of electronic components 2 mounted thereon. Consequently, the electronic component unit 1 can respond to a larger number of variations.

In an electronic component unit, an electric connection box, and a wire harness according to the present embodiment, a substrate having electronic components mounted thereon is retained between a casing and a connection unit in the state in which the substrate is assembled to slide assembling units in a housing space portion in the casing, and terminals of the substrate are electrically connected to wiring members through the connection unit. In this case, the electronic component unit, the electric connection box, and the wire harness may be configured such that the substrate is provided to at least one of the slide assembling units and is not provided to the other slide assembling units, or such that the substrates are provided to all the slide assembling units. Consequently, the effect that versatility can be improved is obtained.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic component unit, comprising:
   a substrate on which an electronic component is mounted, and includes a terminal electrically connected to the electronic component;
   a casing that is formed into a hollow shape having an opening, and includes a housing space portion that houses the substrate therein and a plurality of slide assembling units that are provided in the housing space portion and allow the substrate to be inserted and assembled thereto from the opening side along a first direction; and
   a connection unit that is provided in the opening in the casing, into which the terminal of the substrate assembled to the slide assembling units in the housing space portion is inserted, and is configured to electrically connect the terminal and a conductive wiring member, wherein
   the substrate is assembled to any one of the slide assembling units and is retained between the casing and the connection unit,
   wherein the substrate includes a bent end portion that extends in a second direction orthogonal to the first direction, and
   wherein the terminal is provided on the bent end portion.

2. The electronic component unit according to claim 1, wherein
   the slide assembling units include rail units each of which extends along the first direction and is configured to position the bent end portion of the substrate with respect to the second direction intersecting with the first direction, and
   the slide assembling units are provided in a pair so as to be opposed in the second direction.

3. The electronic component unit according to claim 1, wherein
   the substrate is provided to each of the slide assembling units.

4. The electronic component unit according to claim 2, wherein
   the substrate is provided to each of the slide assembling units.

5. The electronic component unit according to claim 1, wherein the substrate is provided to at least one of the slide assembling units and is not provided to the other slide assembling units.

6. The electronic component unit according to claim 2, wherein
the substrate is provided to at least one of the slide assembling units and is not provided to the other slide assembling units.

7. The electronic component unit according to claim 1, wherein
a pair of substrates provided to adjacent ones of the slide assembling units have the same structure, and
the electronic components on the pair of substrates are provided on surfaces opposed to each other in the second direction intersecting with the first direction, and at least a part of the electronic components are located side by side in the first direction.

8. The electronic component unit according to claim 2, wherein
a pair of substrates provided to adjacent ones of the slide assembling units have the same structure, and
the electronic components on the pair of substrates are provided on surfaces opposed to each other in the second direction intersecting with the first direction, and at least a part of the electronic components are located side by side in the first direction.

9. The electronic component unit according to claim 3, wherein
a pair of substrates provided to adjacent ones of the slide assembling units have the same structure, and
the electronic components on the pair of substrates are provided on surfaces opposed to each other in the second direction intersecting with the first direction, and at least a part of the electronic components are located side by side in the first direction.

10. The electronic component unit according to claim 4, wherein
a pair of substrates provided to adjacent ones of the slide assembling units have the same structure, and
the electronic components on the pair of substrates are provided on surfaces opposed to each other in the second direction intersecting with the first direction, and at least a part of the electronic components are located side by side in the first direction.

11. The electronic component unit according to claim 5, wherein
a pair of substrates provided to adjacent ones of the slide assembling units have the same structure, and
the electronic components on the pair of substrates are provided on surfaces opposed to each other in the second direction intersecting with the first direction, and at least a part of the electronic components are located side by side in the first direction.

12. The electronic component unit according to claim 6, wherein
a pair of substrates provided to adjacent ones of the slide assembling units have the same structure, and
the electronic components on the pair of substrates are provided on surfaces opposed to each other in the second direction intersecting with the first direction, and at least a part of the electronic components are located side by side in the first direction.

13. An electric connection box, comprising:
an electronic component unit including:
a substrate that has an electronic component mounted thereon and the substrate includes a terminal electrically connected to the electronic component;
a casing that is formed into a hollow shape having an opening, and includes a housing space portion that houses the substrate therein and a plurality of slide assembling units that are provided in the housing space portion and allow the substrate to be inserted and assembled thereto from the opening side along a first direction; and
a connection unit that is provided in the opening in the casing, into which the terminal of the substrate assembled to the slide assembling units in the housing space portion is inserted, and is configured to electrically connect the terminal and a conductive wiring member; and
a frame to which the electronic component unit is assembled, wherein
the substrate is assembled to any one of the slide assembling units and is retained between the casing and the connection unit,
wherein the substrate includes a bent end portion that extends in a second direction orthogonal to the first direction, and
wherein the terminal is provided on the bent end portion.

14. A wire harness, comprising:
a conductive wiring member; and
an electric connection box electrically connected to the wiring member, wherein
the electric connection box includes:
an electronic component unit including:
a substrate that has an electronic component mounted thereon and includes a terminal electrically connected to the electronic component;
a casing that is formed into a hollow shape having an opening, and includes a housing space portion that houses the substrate therein and a plurality of slide assembling units that are provided in the housing space portion and allow the substrate to be inserted and assembled thereto from the opening side along a first direction; and
a connection unit that is provided in the opening in the casing, into which the terminal of the substrate assembled to the slide assembling units in the housing space portion is inserted, and is configured to electrically connect the terminal and the wiring member; and
a frame to which the electronic component unit is assembled, and
the substrate is assembled to any one of the slide assembling units and is retained between the casing and the connection unit,
wherein the substrate includes a bent end portion that extends in a second direction orthogonal to the first direction, and
wherein the terminal is provided on the bent end portion.

15. The electronic component unit according to claim 1, wherein the bent end portion of the substrate includes a plurality of terminals that are provided along a width of the bent end portion that extends in a third direction orthogonal to the first direction and the second direction.

16. The electronic component unit according to claim 1, wherein an end of the substrate, that is disposed apart from the bent end portion, is configured to be inserted into one of the slide assembling units from the opening side along the first direction.

* * * * *